(12) United States Patent
Liska et al.

(10) Patent No.: US 8,374,029 B2
(45) Date of Patent: Feb. 12, 2013

(54) ELECTRICALLY ADDRESSED NON-VOLATILE MEMORY MAINTENTANCE

(75) Inventors: Peggy Jean Liska, Sugar Land, TX (US); Aaron Jabari Russell, Houston, TX (US); Anthony Scott Vaughan, Missouri City, TX (US)

(73) Assignee: Texas Instruments Incorporated, Dallas, TX (US)

( * ) Notice: Subject to any disclaimer, the term of this patent is extended or adjusted under 35 U.S.C. 154(b) by 202 days.

(21) Appl. No.: 13/047,798

(22) Filed: Mar. 15, 2011

(65) Prior Publication Data
US 2012/0236648 A1    Sep. 20, 2012

(51) Int. Cl.
*G11C 11/34*    (2006.01)
(52) U.S. Cl. ......... 365/185.03; 365/185.18; 365/185.19; 365/185.24; 365/185.33
(58) Field of Classification Search ............. 365/185.03, 365/185.18, 185.19, 185.24, 185.33
See application file for complete search history.

(56) References Cited

U.S. PATENT DOCUMENTS

| | | | | |
|---|---|---|---|---|
| 5,995,418 A | * | 11/1999 | Chen et al. | 365/185.24 |
| 7,522,455 B2 | * | 4/2009 | Bedarida et al. | 365/185.03 |
| 7,590,007 B2 | * | 9/2009 | Futatsuyama | 365/185.19 |
| 7,656,710 B1 | * | 2/2010 | Wong | 365/185.18 |

\* cited by examiner

*Primary Examiner* — Trong Phan
(74) *Attorney, Agent, or Firm* — Robert D. Marshall, Jr.; Wade James Brady, III; Frederick J. Telecky, Jr.

(57) ABSTRACT

An electrically addressed non-volatile memory is maintained by measuring a voltage threshold for each selected memory cell in the electrically addressed non-volatile memory. The voltage threshold is a voltage around which a controllable voltage signal applied to a control gate of a selected memory cell produces a change in value read from the selected memory cell. A measured voltage threshold distribution of the measured voltage thresholds is generated for the selected memory cells. The voltage threshold distribution is analyzed to identify memory cells having greater probabilities of read errors, for example. In response to the analysis, an operating parameter that affects the memory cells identified as having greater probabilities of read errors is selectively changed.

20 Claims, 3 Drawing Sheets

ELECTRICALLY ADDRESSED NON-VOLATILE MEMORY MAINTENTANCE

BACKGROUND

Electrically addressed non-volatile memory (including "flash" memory, both of which are referred to herein as "flash" memory) is formed in the substrate of an integrated circuit. The flash memory is electrically addressed and can be electrically erased and reprogrammed so that the state of memory is not lost when power is removed from the integrated circuit. Various kinds of flash memory are erased on a block-by-block basis and can be programmed (for example, written to) one bit at a time. A memory cell in the flash memory uses a charge stored in a floating gate of the memory cell to store a logical value. An erased bit of a memory cell is often stored (and read) as a logic "one," in which case a programmed bit of the memory cell is stored and read as logic "zero." A read-level voltage that is applied to the control gate of the memory cell is used to read the stored logical value, while the stored charge in the floating gate determines whether the memory cell is read as logic one or zero. The flash memory has a limited number of erase/program cycles, and is subject to errors due to variations in the voltage threshold used to read each of the memory cells in the flash memory. The variations result, for example, from repeated erase/program cycles that progressively affect the ability of a floating gate to hold a stored charge.

SUMMARY

The problems noted above are solved in large part by measuring the voltage threshold of flash memory bit cells (memory cells) in a flash memory cell array, determining a distribution of cells having similar voltage thresholds, and providing address translation data in response to the distribution of the voltage thresholds of flash memory bit cells in a flash memory cell array. As disclosed herein, an electrically addressed non-volatile memory is maintained by measuring a voltage threshold for each selected memory cell in the electrically addressed non-volatile memory. The voltage threshold is a voltage around which a controllable voltage signal applied to a control gate of a selected memory cell produces a change in value read from the selected memory cell. A measured voltage threshold distribution of the measured voltage thresholds is generated for the selected memory cells. The voltage threshold distribution is analyzed to identify memory cells having greater probabilities of read errors, for example. In response to the analysis, an operating parameter that affects the memory cells identified as having greater probabilities of read errors is selectively changed.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms are used throughout the following description and appended claims to refer to particular system components. As one skilled in the art will appreciate, various names can be used to refer to a component. Accordingly, distinctions are not necessarily made herein between components that differ in name but not function. In the following discussion and in the claims, the terms "including" and "comprising" are used in an open-ended fashion, and thus are to be interpreted to mean "including, but not limited to . . . ." Further, the meaning of the term "or" (as an inclusive or an exclusive "or") is determined by the surrounding context in which the term is used. Also, the terms "coupled to" or "couples with" (and the like) are intended to describe either an indirect or direct electrical connection. Thus, if a first device couples to a second device, that connection can be through a direct electrical connection, or through an indirect electrical connection via other devices and connections.

Figure 1:
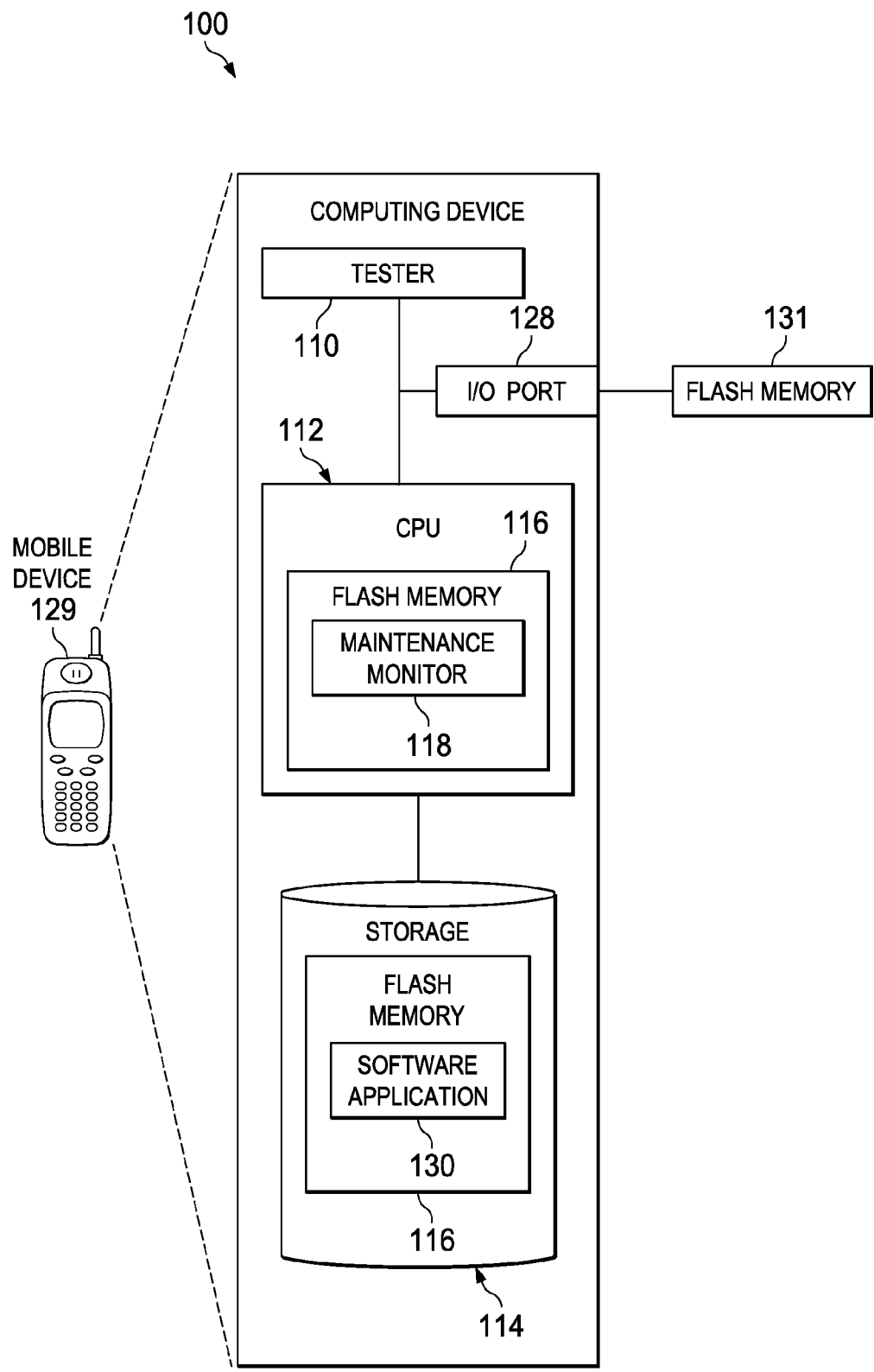
FIG. 1 shows an illustrative computing device 100 in accordance with embodiments of the disclosure.

FIG. 1 shows an illustrative computing device 100 in accordance with embodiments of the disclosure. The computing device 100 is, or is incorporated into, a multimedia device 129, such as a video projector, a home theater system, a computer monitor with amplified speakers, a personal digital assistant (e.g., a BLACKBERRY® device), a personal computer, automotive electronics, or any other type of electronic system.

In some embodiments, the computing device 100 comprises a megacell or a system-on-chip (SoC) which includes control logic such as a CPU 112 (Central Processing Unit), a storage 114 (e.g., random access memory (RAM)) and tester 110. The CPU 112 can be, for example, a CISC-type (Complex Instruction Set Computer) CPU, RISC-type CPU (Reduced Instruction Set Computer), or a digital signal processor (DSP). The storage 114 (which can be memory such as RAM, flash memory, or disk storage) stores one or more software applications 130 (e.g., embedded applications) that, when executed by the CPU 112, perform any suitable function associated with the computing device 100. The tester 110 comprises logic that supports testing and debugging of the computing device 100 executing the software application 130. For example, the tester 110 can be used to emulate a defective or unavailable component(s) of the computing device 100 to allow verification of how the component(s), were it actually present on the computing device 100, would perform in various situations (e.g., how the component(s) would interact with the software application 130). In this way, the software application 130 can be debugged in an environment which resembles post-production operation.

The CPU 112 typically comprises memory (including flash memory) and logic which store information frequently accessed from the storage 114. The CPU 112 is arranged to control and/or implement the functions of the flash memory 116 and the maintenance monitor 118, which are used during the execution the software application 130. Portions of the maintenance monitor 118 can be distributed amongst other components of the computing device 100 and/or the flash memory 131. The CPU 112 is coupled to I/O (Input-Output) port 128, which provides an interface (that is configured to receive input from (and/or provide output to) peripherals and/or computing devices, including tangible media (such as the flash memory 131) and/or cabled or wireless media (such as a Joint Test Action Group (JTAG) interface).

Thus, the disclosed computing device 100 is arranged to determine a distribution of voltage thresholds of memory cells in a flash memory cell array and to change an operating parameter in response to the measured distribution of the voltage thresholds of memory cells in a flash memory cell array. For example, maintenance monitor 118 can be used to measure the voltage threshold distribution of the memory cells in the flash memory 116 and/or 131 and to provide address translation data in response to the measured distribution of the voltage threshold distribution of memory cells in a flash memory cell array. As disclosed herein, the address translation data can be used to extend the expected life time of the monitored flash memory 116 and/or 131 by minimizing program erase/cycles that would otherwise be performed on "weaker" cells (for example, those cells have a higher probability of not storing a programming charge correctly over a period of time). The weaker cells are identified by the measured distribution of voltage thresholds of memory cells in the monitored flash memory cell array.

Figure 2:
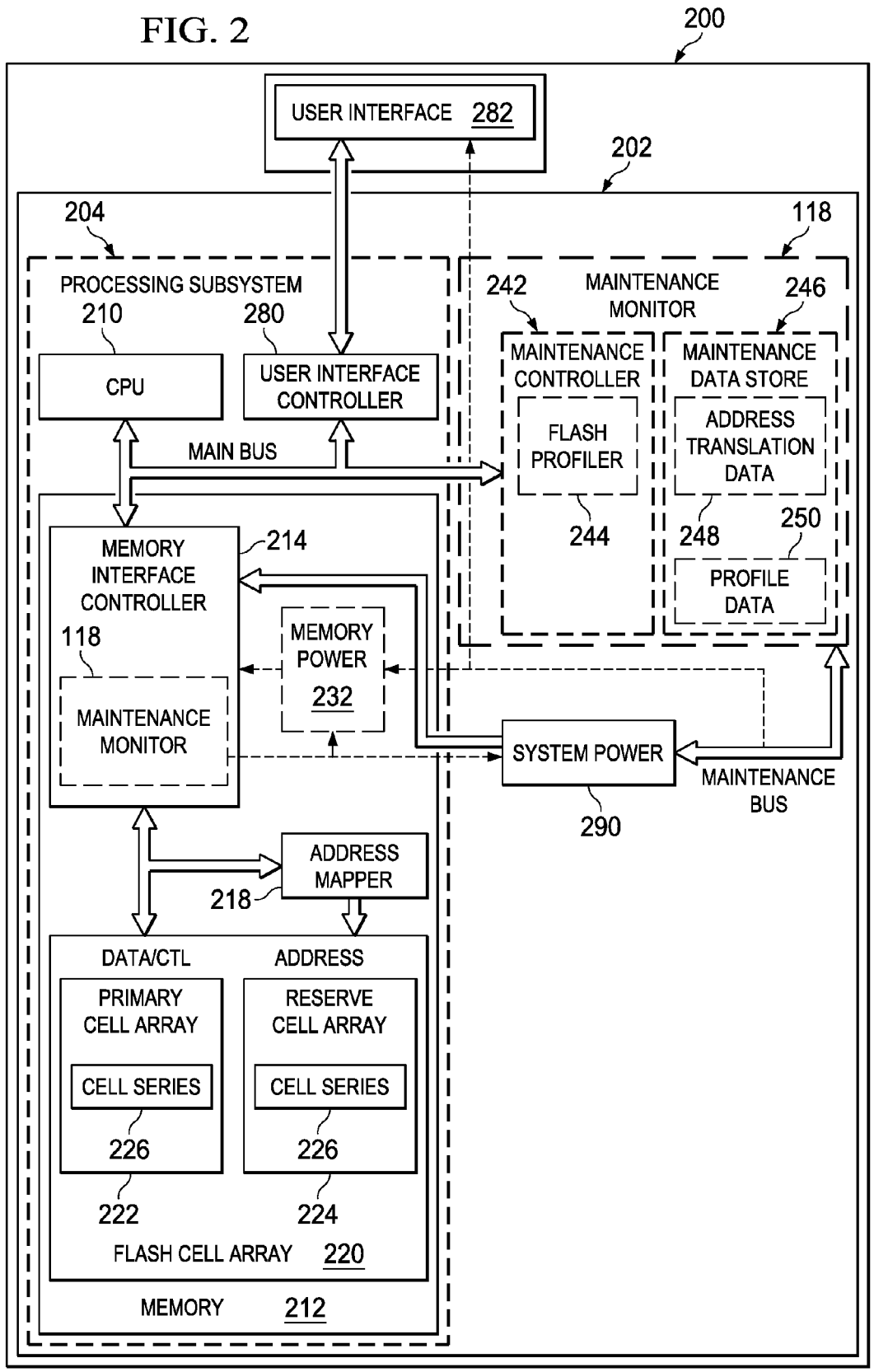
FIG. 2 is a schematic diagram illustrating an electrically addressed non-volatile memory maintenance system in accordance with embodiments of the disclosure.

FIG. 2 is a schematic diagram illustrating an electrically addressed non-volatile memory maintenance system in accordance with embodiments of the disclosure. Computing system 200 is illustrated as including a common substrate 202 upon which the illustrated elements of the computing system 200 are formed. Forming the illustrated elements of the computing system 200 on the common substrate 202, for example, provides increased integration and reduces the number of connections for which drivers, bonding pads, and wiring would otherwise be used. In various embodiments, the elements illustrated as being formed in substrate 202 are optionally included in separate circuit boards and packages (such as the user interface 282).

The user interface controller 280 is arranged to prepare commanded information for display and to generate video control signals used to control the user interface 282 so that generated information can be displayed. Likewise, the user interface controller 280 is arranged to receive input information from a user via the user interface 282 so that the input information can be conveyed to the CPU 210. For example, a user can select a point on a displayed curve that identifies which memory cells are to be functionally replaced or that identifies what operating voltage should be used. In various embodiments, the user interface controller 280 is arranged to perform DMA (Direct Memory Accesses) accesses of memory and/or receiving commanded information from the CPU 210.

System power 290 is used to power both the elements of substrate 202 and the user interface 282 (such as a dashboard indicator or a histogram display interface), although the user interface 282 can be partially or completely powered by another power supply. System power 290 and/or memory power 232 are controllable (including programmable) power supplies, for example, that are arranged to generate a series of adjusted voltages for testing threshold voltages of (selected) individual cells in memory 212. Accordingly, the series of adjusted voltages can be a ramp (e.g., increasing or decreasing sawtooth) or a binary search (where the instant voltage of the series of adjusted voltages is selected and adjusted in response to a value that is read from the memory cell under test).

The processing subsystem 204 (which is also a processing system in its own right) of substrate 202 typically includes a CPU 210, memory 212, and a user interface controller 280. CPU 210 is a DSP, controller, microprocessor, or the like, and is used to control at least the processing subsystem 204. Thus, the CPU 210 can be used to implement functions of the maintenance monitor 118 and/or the maintenance monitor may provide its own processor. CPU 210 is typically coupled to a memory interface 214 that is arranged to control accesses to memory 212.

The memory 212 is arranged to store information used by CPU 210 and information used for control and operational parameters for the maintenance monitor 118 as discussed below. The memory 212 includes a memory interface controller 214, an address mapper 218, a flash memory cell array 220, and memory power 232. The memory interface controller 214 is arranged to permit memory accesses by CPU 210 or DMA (Direct Memory Accesses) of the memory 212 by subsystems such as the user interface controller 280 and maintenance monitor 118 without requiring intervention by the CPU 210.

In one embodiment, the maintenance monitor 118 is formed in the same substrate as the memory 212; whereas in other embodiments, the components (or portions thereof) of the maintenance monitor 118 can be included within the memory 212 or distributed amongst other components of the computing system 200.

The address mapper 218 is arranged to receive addresses (via an address bus, for example) for addressing data to be read from or written to the flash cell array 220 and to translate the received addresses to physical addresses of the flash cell array 220. As discussed below, address mapper 218 allows different (or the same, if not remapped) physical cells of the flash cell array to be used for a received (logical) memory address by selectively translating logical to physical addresses in accordance with a memory map.

The flash cell array 220 includes, for example, a primary cell array 222 and a reserve cell array 224. The primary cell array 222 and the reserve cell array 224 include one or more cells series 226. The cell series 226 includes a series of memory cells that are addressed as a unit, such as a bit line of cells (as discussed below with respect to FIG. 3). The reserve cell array 224 provides redundancy so that, for example, a cell series 226 from the reserve cell array 224 can be used to functionally substitute for a cell series 226 that is within the primary cell array 222. A cell series 226 in the primary cell array 222 is "mapped out" (via the address mapper 218) and functionally replaced by a cell series 226 in the reserve cell array 224. The maintenance monitor 118 (as discussed below) selects the cell series 226 in the primary cell array 222 for replacement in response to, for example, an analysis of voltage thresholds of memory cells of the cell series 226 within the primary cell array 222.

In operation, the flash cell array 220 receives data (via a data bus, for example) and timing information (via a control bus, for example) from the memory interface controller 214. The flash cell array 220 receives address information from the address mapper 218. As discussed above, the information from the address mapper 218 is used to select a cell series 226 from either the primary cell array 222 or the reserve cell array 224. The operation of an example cell series 226 is now discussed.

Figures 3, 4:
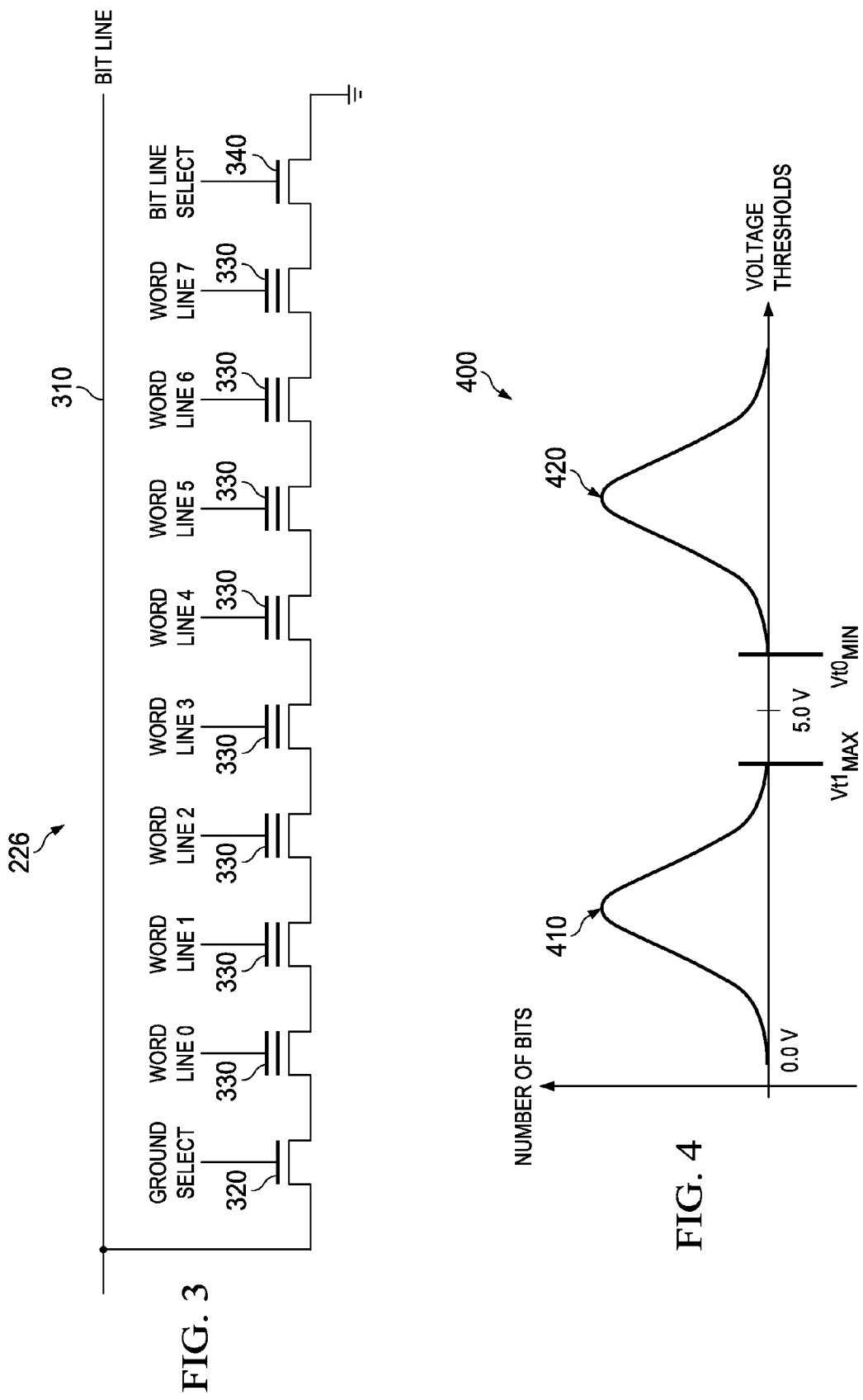
FIG. 3 is a schematic diagram illustrating a cell series of an electrically addressed non-volatile memory maintenance system in accordance with embodiments of the disclosure.
FIG. 4 is a histogram illustrating a distribution of memory cells having similar voltage thresholds.

FIG. 3 is a schematic diagram illustrating a cell series of an electrically addressed non-volatile memory maintenance system in accordance with embodiments of the disclosure. Each of the cells series 226 includes a bit line 310 that is coupled in series with the conductive terminals of transistors such as the ground select transistor 320, the word line transistors 330, and the bit line select transistor 340. The ground select transistor 320 and the bit line select transistor 340 are typically standard MOSFET devices, whereas each of the word line transistors 330 has a floating gate. Typically, each of the word line transistors 330 is a single-level cell device (for storing binary information), although multi-level cell devices (with each of the multi-level devices storing at least ternary information, for example) can be used with embodiments of the disclosure.

Each of the word line transistors 330 includes two gates: a conductive gate and a floating gate that lies in a dielectric layer between the control gate and the area in which a MOSFET channel is formed. Because the floating gate is insulated from the control gate (and the channel area), electrons stored in the floating gate area usually do not discharge until after relatively long periods of time (e.g., years or decades) under optimal operating conditions.

Electrons are stored in a floating gate area of a transistor to be programmed by using "hot" electronic injection in which an elevated (e.g., a programming level) voltage is applied to the control gate and a large source-drain current is generated. Electrons can be removed from the floating gate area by quantum tunneling in which a relatively large voltage (of reverse-polarity) is applied between the control gate and the source of the transistor to be erased. Memory power 232 (in FIG. 2), for example, uses charge pumps to provide program/erase voltages that are higher (or lower) than operating voltages used for read operations. Alternatively, system power 290 can be used to generate and/or couple such voltages.

Repeating the number of program/erase cycles of a transistors decreases the period of time in which the transistor can retain a substantial amount of charge in the floating gate in a memory cell. A substantial amount of charge in a floating gate is, for example, an amount of a charge above which a correct value is read from the cell. Erasures are performed, for example, on a "block" of cell series 226 (which often have contiguous addresses and/or share common bits of addresses). Accordingly, the greatest probability in which a floating gate of one transistor in a cell series cannot hold a substantial amount of charge can be used as the probability for the cell series 226 or the block in which the transistor (having a floating gate with the greatest probability of not holding a substantial amount of charge) resides. As discussed below, such probabilities are used for purposes of allocation (of currently non-allocated memory resources) and de-allocation (of currently allocated memory resources).

Each of the cell series 226 is arranged as a NAND-(negated-and-) style flash memory. Each word line transistor 330 of the cell series 226 can be read by successively applying different voltage thresholds to the control gates of the word line transistors 330. A voltage threshold is a value around which a voltage applied to a word line causes a flash cell to be read as a value that is opposite the applied logical value. For example, Vt0 is a threshold voltage at which a programmed bit would be read as an erased bit, and Vt1 is a threshold voltage at which an erased bit would be read as a programmed bit.

When the value of one of the word line transistors 330 is to be read, a voltage that is above the threshold voltage Vt0 is applied to all word line transistors 330 except for the word line transistor 330 to be read. Instead, an intermediate voltage, below the minimum Vt0 threshold voltage ($Vt0_{min}$) and above the maximum Vt1 threshold voltage ($Vt1_{max}$), at which an erased bit would be read as an erased bit is applied to the control gate of the word line transistor 330 to be read. The voltage range lying between $Vt0_{mm}$ and $Vt1_{max}$ provides a buffer that ensures that bits in the memory cells are read correctly.

The charge of the electrons stored in the floating gate modifies the threshold voltage applied to the word line transistor 330 to be read. Accordingly, the voltage applied to the control gate of the word line transistor 330 to be read is an intermediate voltage. The intermediate voltage is selected such that the stored charge in the floating gate of the word line transistor 330 to be read determines whether the word line transistor 330 to be read conducts (or does not conduct) when other word line transistors 330 in the cell series 226 are turned on with substantially higher gate voltages.

With reference again to FIG. 2, the maintenance monitor 118 includes a maintenance controller 242 and a maintenance data store 246. Maintenance controller 242 is arranged to perform maintenance tasks with respect to electrically addressed non-volatile memory (flash) memory. Maintenance controller 242 includes programmable logic and/or shares execution of the maintenance tasks with CPU 210.

The maintenance controller 242 includes a flash profiler 244, which is arranged (for example) to measure the Vt0 and Vt1 voltage thresholds of each memory cell in a flash memory cell array and to determine a distribution of memory cells having similar voltage thresholds. In one embodiment, a flash cell array having an existing program (e.g., selectively programmed such that both logic "ones" and "zeros" are stored) can be scanned to determined a distribution of memory cells having similar voltage thresholds. The flash cell array can be scanned at periodic intervals of the lifespan of the flash cell array to also detect bits that are loosing or gaining charge over time from normal storage or read operations.

By comparing the measured voltage thresholds respectively against $Vt1_{max}$ and $Vt0_{min}$, a determination can be made, for example, whether the charge stored in the floating gate of a memory cell is sufficient for at least one of a particular application and the process used to form the flash cell array 220. As discussed below, individual cell series 226 have bits approaching a reference voltage (e.g., 5 volts) that lies between the $Vt1_{max}$ and $Vt0_{min}$ can be de-allocated, new cell series 226 allocated, and the programming information from the de-allocated cell series 226 can be transferred to the new cell series 226.

For example, all cell series 226 (allocated or otherwise) can be programmed and then scanned to determine a distribution of cells having similar Vt1 voltage thresholds. Likewise, all cell series 226 (allocated or otherwise) are optionally erased (often on a block basis) and then scanned to determine a distribution of cells having similar Vt0 voltage thresholds.

In another embodiment, a flash cell array can be evaluated to determine the capability of the flash cell array 220 to be programmed and calculate a likelihood for how long the programming can be stored (e.g., in view of length of time and/or number of potentially remaining erase/program cycles and/or in view of a specific software application 130 executing using flash memory 116). Thus the evaluation of the voltage thresholds for the cell series are performed at the beginning of the "life" of the flash cell array 220 and repeated throughout the life of the flash cell array 220 to more effectively use limited memory resources provided by the memory cell array 220.

During the voltage threshold scan, erased bits (which are erased such that logic "ones") are successively read in the flash cell array 220 by using a series of adjusted voltages to drive the control gate of the transistors of cell series 226. Likewise, programmed bits (which are programmed such that logic "zeros") are successively read in the flash memory 220 by using a series of adjusted voltages to drive the control gate of transistors of cell series 226. The information from the successive scan of the flash cell array 220 is used to determine a distribution of cells having similar voltage thresholds. The distribution of cells having similar voltage thresholds can be plotted using a histogram as illustrated by FIG. 4.

FIG. 4 is a histogram illustrating a distribution of cells having similar voltage thresholds. Graph 400 has a vertical axis that represents numbers of cells/bits and a horizontal axis that represents voltage thresholds. Thus, graph 400 is a histogram showing the distribution of cells having similar voltage thresholds. Curve 410 illustrates a distribution for voltage threshold Vt1 (a threshold voltage at or below which an erased bit would be read as a programmed bit) and curve 420 illustrates a distribution for voltage threshold Vt0 (a threshold voltage at or above which a programmed bit would be read as an erased bit). A nominal read voltage, illustrated in FIG. 4 as 5 volts, can have other voltage levels in accordance with a particular flash technology used to implement the flash cell array 220.

As cells within a flash memory are repeatedly programmed and erased, curves 410 and 420 "flatten" such that the voltage buffer between $Vt1_{max}$ and $Vt0_{min}$ decreases and the probability that errors occur rises when cells having voltage thresholds near the voltage buffer are read. The flash memory voltage threshold profile information as disclosed herein is used to selectively allocate flash memory resources in response to actual need (in contrast with convention methods that, for example, allocate resources in response to program/erase cycle counts). The flash memory voltage threshold profile information as disclosed herein is also used to selectively change an operating voltage to, for example, center an operating voltage point between $Vt1_{max}$ and $Vt0_{min}$.

The maintenance controller 242 (as illustrated in FIG. 2) uses the flash memory voltage threshold profile information generated by the flash profiler 244 to determine address translation data in response to the distribution of the voltage thresholds of memory cells in a flash memory cell array. For example, the flash memory voltage threshold profile information is analyzed using statistical tools such as standard deviation, skew, mean, $Vt1_{max}$, $Vt0_{min}$, maximum number of bits changed in one voltage increment, and the peak of each curve 410 and 420.

The functions that return the values of $Vt1_{max}$ and $Vt0_{min}$ can be used to determine the width of the voltage buffer and the symmetry of $Vt1_{max}$ and $Vt0_{min}$ about an intermediate voltage. For example, an operational voltage such as 5 volts can be adjusted by controlling the output voltages of memory power 232 and/or system power 290 so that the operating voltage lies at the average voltage between of $Vt1_{max}$ and $Vt0_{min}$. Adjusting the operating voltage so that it lies at the average voltage between of $Vt1_{max}$ and $Vt0_{min}$ decreases the probability that cells having threshold voltages close to either of $Vt1_{max}$ and $Vt0_{min}$ would be read incorrectly.

The standard deviation function is used to identify memory cells that fall in the standards of deviations that contain either the $Vt1_{max}$ or $Vt0_{min}$ voltage thresholds. For example, a distribution (such as illustrated by curve 410 mentioned above) may be a bell curve centered about the statistical mean of the curve. The memory cells that fall in the standard of deviation that include the $Vt1_{max}$ threshold are identified for de-allocation. De-allocation allows the identified cells, for example, to be functionally replaced by mapping "fresh" memory cells (or, e.g., cell series 226) or other previously de-allocated (e.g. reallocated) cells (or, e.g., cell series 226) that have lower voltage thresholds than the memory cells being functionally replaced.

The voltage thresholds for the memory cells (or, e.g., cell series 226) used for reallocation can be readily accessed by consulting the profile data for the last voltage threshold measured for a memory cell. Thus, the flash cell array efficiently uses memory resources so that the quality and reliability of a flash memory-based device is enhanced over a longer lifespan for a device used in a broad range of applications, including arbitrary programs that do not specifically manage memory usage to maximize flash memory life-spans.

The maintenance controller 242 stores the flash memory voltage threshold profile information and other statistical data generated in the maintenance data store 246. For example, an address map associated with the allocation, de-allocation, and reallocation of cell series 226 (or blocks of cell series 226) is stored as address translation data 248. As voltage profile measurements of the flash cell array 220 are periodically performed, historical information of cell series 226 usage and/or numerical metric specifying the "health" (e.g., an indication of device reliability) of a cell series 226 are stored as profile data 250.

The profile data 250 in the maintenance data store 246 is, for example, used to store the least favorable voltage threshold of a memory cell of each cell series 226 (or block containing the cell series 226) of both the primary cell array 222 and reserve cell array 224. Accordingly, the stored least favorable voltage threshold of a memory cell of each cell series 226 (or block containing the cell series 226) can be used to readily identify suitable cell series 226 as functional replacements, despite the fact the identified suitable cell series 226 (or block containing the cell series 226) may have been previously de-allocated. The profile data 250 can be updated each time the flash memory voltage threshold profile information is obtained.

Profile data 250 also is used to store flash cell array 220 operational parameters (such as architecture, operating voltages, erase voltages, program parameters, "health" indicators, and the like). The maintenance store data is optionally used by software application 130 to implement a memory management policy, which, for example, avoids repeated program and erase cycles to a single memory location.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

What is claimed is:

1. A circuit for maintaining electrically addressed non-volatile memory, comprising:
    a profiler that is arranged to measure a voltage threshold for each selected memory cell, wherein the voltage threshold is a voltage around which a controllable voltage signal applied to a control gate of a selected memory cell produces a change in value read from the selected memory cell, and that is arranged to produce a measured voltage threshold distribution of the measured voltage thresholds for the selected memory cells; and
    a controller that is arranged to perform an analysis of the voltage threshold distribution, and in response to the analysis, to selectively change an operating parameter of the selected memory cells.

2. The circuit of claim 1, wherein the profiler is arranged to measure the voltage threshold for each selected memory cell by applying a series of adjusted voltages to a control gate of a selected memory cell until a read of the selected memory cell produces a change in the value read from the selected memory cell.

3. The circuit of claim 2, wherein the profiler is arranged to measure the voltage threshold for each selected memory cell by successively reading each of the selected memory cells before adjusting the voltage applied to the control gates of the selected memory cells to read one of the selected memory cells.

4. The circuit of claim 1, comprising a substrate in which the selected memory cells, the profiler, and the controller are arranged.

5. The circuit of claim 4, wherein the substrate includes a programmable power supply for generating the controllable voltage signal.

6. The circuit of claim 1, wherein the controller is arranged to perform an analysis of the voltage threshold distribution by determining a $vt0_{min}$ (the lowest value measured for a threshold voltage at or above which a programmed bit would be read as an erased bit) and a $vt1_{max}$ (the highest value measured for a threshold voltage at or below which an erased bit would be read as a programmed bit).

7. The circuit of claim 6, wherein the controller is arranged to perform an analysis of the voltage threshold distribution by performing a standard of deviation analysis with respect to $vt0_{min}$.

8. The circuit of claim 7, wherein the controller is arranged to perform an analysis of the voltage threshold distribution by performing a standard of deviation analysis with respect to $vt1_{max}$.

9. The circuit of claim 1, wherein the controller is arranged to selectively change an operating parameter of the selected memory cells by changing a memory map for translating addresses of the memory cells identified by the analysis of the voltage threshold distribution.

10. The circuit of claim 1, wherein the controller is arranged to selectively change an operating parameter of the selected memory cells by adjusting an operating voltage of the selected memory cells.

11. A processing system, comprising:
a memory that includes electrically addressed non-volatile memory cells; and
a processor that is arranged to measure a voltage threshold for each selected memory cell, wherein the voltage threshold is a voltage around which a controllable voltage signal applied to a control gate of a selected memory cell produces a change in value read from the selected memory cell, that is arranged to produce a measured voltage threshold distribution of the measured voltage thresholds for the selected memory cells, that is arranged to perform an analysis of the voltage threshold distribution, and in response to the analysis, to selectively change an operating parameter of the selected memory cells.

12. The system of claim 11, comprising a controllable power supply that is arranged to incrementally increase or decrease a controllable voltage signal applied to a control gate of a selected memory cell to determine a voltage threshold for each selected memory cell around which a reading of the selected memory cell produces a change in the value read from the selected memory cell.

13. The system of claim 11, wherein the processor is arranged to perform an analysis of the voltage threshold distribution by determining a $vt0_{min}$ (the lowest value measured for a threshold voltage at or above which a programmed bit would be read as an erased bit) and a $vt1_{max}$ (the highest value measured for a threshold voltage at or below which an erased bit would be read as a programmed bit) in response to the determined voltage thresholds for each selected memory cell.

14. The system of claim 11, wherein the electrically addressed non-volatile memory cells are flash memory cells arranged as an array of cell series.

15. The system of claim 14, comprising an address mapper that is arranged to select a non-currently mapped cell series in response to the changed operating parameter of the selected memory cells and to deselect a currently mapped cell series in response to the changed operating parameter of the selected memory cells.

16. The system of claim 11, comprising a controllable power supply that is arranged to change an operating voltage of the selected memory cells in response to the changed operating parameter.

17. A method for maintaining electrically addressed non-volatile memory, comprising:
measuring a voltage threshold for each selected memory cell in the electrically addressed non-volatile memory, wherein the voltage threshold is a voltage around which a controllable voltage signal applied to a control gate of a selected memory cell produces a change in value read from the selected memory cell;
generating a measured voltage threshold distribution of the measured voltage thresholds for the selected memory cells;
analyzing the voltage threshold distribution to identify memory cells having greater probabilities of read errors; and
in response to the analysis, selectively changing an operating parameter affecting the memory cells identified as having greater probabilities of read errors.

18. The method of claim 17 wherein the analyzing the voltage threshold distribution to identify memory cells having greater probabilities of read errors uses a standard of deviation function.

19. The method of claim 17, comprising changing an operating voltage of the selected memory cells in response to the changed operating parameter.

20. The method of claim 17, comprising allocating a non-allocated cell series in response to the changed operating parameter of the selected memory cells to produce a newly-allocated cell series, de-allocating a currently mapped cell series in response to the changed operating parameter of the selected memory cells, and transferring the data of the de-allocated cell series to the newly allocated cell series.

* * * * *